US012720798B2

(12) United States Patent
Ferrara et al.

(10) Patent No.: US 12,720,798 B2
(45) Date of Patent: Aug. 25, 2026

(54) SEMICONDUCTOR DIE AND METHOD OF MANUFACTURING THE SAME

(71) Applicant: Infineon Technologies Austria AG, Villach (AT)

(72) Inventors: Alessandro Ferrara, Villach (AT); Daniel Regenfeldner, Sauerlach (DE); Thomas Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 460 days.

(21) Appl. No.: 18/349,536

(22) Filed: Jul. 10, 2023

(65) Prior Publication Data

US 2024/0021722 A1 Jan. 18, 2024

(30) Foreign Application Priority Data

Jul. 13, 2022 (EP) .................................... 22184740

(51) Int. Cl.

| | |
|---|---|
| ***H10D 30/66*** | (2025.01) |
| ***H10D 30/01*** | (2025.01) |
| ***H10D 62/10*** | (2025.01) |
| ***H10D 64/00*** | (2025.01) |

(52) U.S. Cl.

CPC ....... *H10D 30/665* (2025.01); *H10D 30/0297* (2025.01); *H10D 30/668* (2025.01); *H10D 62/127* (2025.01); *H10D 64/117* (2025.01)

(58) Field of Classification Search

CPC ............ H10D 30/665; H10D 30/0297; H10D 30/668; H10D 62/127; H10D 64/117; H10D 12/481; H10D 12/038; H10D 62/393; H10D 64/23; H10D 64/01; H10D 30/025; H10D 62/105; H10D 30/63

See application file for complete search history.

(56) References Cited

U.S. PATENT DOCUMENTS

| | | | | |
|---|---|---|---|---|
| 8,487,372 | B1 * | 7/2013 | Hsieh | H10D 30/665 438/257 |
| 8,564,053 | B2 * | 10/2013 | Hsieh | H10D 84/038 257/341 |
| 10,312,363 | B1 * | 6/2019 | Fukunaga | H10D 64/117 |
| 10,868,170 | B2 * | 12/2020 | Hutzler | H10D 30/665 |

(Continued)

*Primary Examiner* — Steven B Gauthier
*Assistant Examiner* — Khatib A Rahman
(74) *Attorney, Agent, or Firm* — Murphy, Bilak & Homiller, PLLC

(57) ABSTRACT

A semiconductor die includes a semiconductor device and an edge termination structure laterally between the semiconductor device and a lateral edge of the die. The edge termination structure includes a first inner shield electrode region with a shield electrode in a trench extending into a semiconductor body, an outer shield electrode region with a shield electrode in a trench extending into the semiconductor body and disposed in a first lateral direction between the first inner shield electrode region and the lateral edge, and a well region formed in the semiconductor body adjacent the trench of the first inner shield electrode region. The shield electrode of the first inner shield electrode region is electrically connected to the well region to tap an electrical potential from the well region. The shield electrode of the outer shield electrode region is electrically connected to the shield electrode of the first inner shield electrode region.

13 Claims, 10 Drawing Sheets

(56) References Cited

U.S. PATENT DOCUMENTS

| | | | | |
|---|---|---|---|---|
| 10,930,774 | B2 * | 2/2021 | Hsieh | H10D 30/665 |
| 11,437,507 | B2 * | 9/2022 | Burke | H10D 30/668 |
| 11,469,317 | B2 * | 10/2022 | Pfirsch | H10D 12/038 |
| 2015/0042177 | A1 * | 2/2015 | Weyers | H10D 64/251<br>307/115 |
| 2016/0064547 | A1 | 3/2016 | Siemieniec et al. | |
| 2017/0018548 | A1 * | 1/2017 | Laven | H10D 62/142 |
| 2017/0250255 | A1 | 8/2017 | Siemieniec et al. | |
| 2019/0006513 | A1 | 1/2019 | Ouvrard et al. | |
| 2021/0242315 | A1 * | 8/2021 | Blank | H01L 21/765 |
| 2022/0216336 | A1 * | 7/2022 | Burke | H10D 64/117 |

* cited by examiner

SEMICONDUCTOR DIE AND METHOD OF MANUFACTURING THE SAME

TECHNICAL FIELD

The present disclosure relates to a semiconductor die with a semiconductor device and an edge termination structure.

BACKGROUND

The edge termination structure is arranged between a lateral edge of the die and an active area, in which the semiconductor device is formed. The latter can in particular be a vertical device having its source and drain region at vertically opposite sides of the semiconductor die. In case of a vertical power FET, its source region can be arranged at the frontside and its drain region at the backside of the die, and the vertical current flow can for instance be controlled by a gate region formed in a vertical gate trench. This shall illustrate a possible device, without limiting the universality of the claims and the description.

SUMMARY

It is an object of the present application to provide a semiconductor die with an improved design, as well as a method of manufacturing such a die.

An edge termination structure formed laterally between a device and the edge of the die comprises a first inner shield electrode region in a trench and an outer shield electrode region in a trench, the trench of the outer shield electrode region disposed in a first lateral direction between the first inner shield electrode region and the edge of the die. Adjacent to the trench of the first inner shield electrode region, a well region is formed in the semiconductor body, to which the first inner shield electrode is electrically connected to tap an electrical potential from the well region. Additionally, the shield electrode of the outer shield electrode region is electrically connected to the first inner shield electrode. In other words, the first inner shield electrode is on the potential of the well region, and the outer shield electrode is connected to this potential.

Consequently, the first inner and the outer shield electrode are on the same electrical potential tapped from the well region. With the well region formed at the frontside of the semiconductor body, the potential can be tapped at the surface, which can allow for connecting the first inner and, in consequence, the outer shield electrode to a potential that is larger than a frontside potential in the active area. In case of the FET discussed above, this can for instance be a gate or source potential, and the edge termination structure can shield the active area from the backside drain potential that can for example reach up to the frontside at the edge of the die. Independently of these details, the “tapping” and “transferring outward” of the electrical potential can enable a scalable edge termination structure and avoid problems at high doping levels, because the potential can increase at the surface.

Particular embodiments and features are provided in this description. Therein, the individual features shall be disclosed independently of a specific claim category, the disclosure relates to apparatus and device aspects, but also to method and use aspects. If for instance a device or edge termination structure manufactured in a specific way is described, this is also a disclosure of a respective manufacturing process, and vice versa. In general words, an approach of this application is to tap the electrical potential at a laterally inner location of the die and bias a shield electrode arranged at a laterally outer location of the die to this potential (the outer location arranged closer to the lateral edge than the inner location).

Assuming for comparison an edge termination structure with a plurality of laterally staggered shield electrodes, each having its own well region, the increase of the potential difference between neighbouring shield electrodes would decrease towards the lateral edge of the die. Consequently, adding more shield electrodes between the device and the edge of the die does not result in a significant increase of the supported breakdown voltage, at least from a certain number of laterally staggered shield electrodes on. In contrast, the edge termination structure of this application can allow for a more efficient use of the edge termination area, e.g. increase the supported breakdown voltage and/or decrease the area required for the edge termination structure. It can also have a positive effect on the dynamical ruggedness in case of fast transients, e.g. after body diode conduction, as a large amount of bipolar charge needs to be removed. Investigations of the inventors showed that the breakdown location can be safely pinned in the active area, e.g. in the cell field of the device.

The well region can be a doped region in the semiconductor body, e.g. a region of a second conductivity type formed in a region of a first conductivity type. In the exemplary embodiments, the first type is n-type and the second type is p-type, in other words a p-well is formed in a n-region. Vertically, the well region can extend from the frontside of the semiconductor body into the latter, it can for instance be formed by implantation through the surface. Its lower end can for example lie on a larger vertical height (closer to the frontside) than a lower end of the shield electrode trenches. The well region is formed adjacent to the first inner shield electrode trench, e.g. adjacent to the shield dielectric of the first inner shield electrode region. Seen in a top view, the well region can surround the device/active area, but it does not necessarily form a closed line. Instead, the line can also be interrupted, separate well region parts arranged along the line to tap the potential at the respective locations.

In the first lateral direction, the well region can for instance have basically the same width as the first inner shield electrode trench. However, in general, it can also reach further outwards, e.g. lie adjacent to a shield electrode trench arranged further outwards, for instance due to space limitations in staggered layouts (hexagonal pattern or the like, see FIG. 8 for illustration). Alternatively and in particular, however, the lateral extension of the well region can be limited such that, seen in a vertical cross section parallel to the first lateral direction, its inner end facing the device is spaced from a next neighbouring trench (e.g. second inner shield electrode trench, see below) and/or its outer end facing the lateral edge of the die is spaced from the next neighbouring trench (e.g. outer shield electrode trench). In other words, the outer shield electrode region or regions can in particular be spaced apart from the well region. In other words again, the trench in which the shield electrode of the outer shield electrode region is disposed can be enclosed completely in a region made of a first conductivity type while the well region is made of a second conductivity type.

The “semiconductor body” can for instance comprise a semiconductor substrate, onto which one or more epitaxial layers have been deposited, e.g. on a frontside of the substrate. The trench or trenches of the edge termination structure, and for instance also of the device (see below), extend from the frontside of the semiconductor body vertically into the latter. The lateral directions lie perpendicular to the respective vertical direction, and the "first lateral direction" can for instance additionally be the direction of a translational symmetry of the trenches arranged consecutive towards the lateral edge of the die, e.g. in the edge termination structure and/or in the cell field (active area). The first lateral direction can in particular lie perpendicular to the lateral edge of the die. The "second lateral direction" lies perpendicular to the vertical direction and encloses an angle with the first lateral direction, in particular it can lie perpendicular to the first lateral direction.

Generally in this disclosure, when the relative arrangement of trenches in the edge termination structure is discussed, the trenches referred to are arranged on the same side of the device/active area (not on opposite sides thereof and, consequently, not at opposite lateral edges of the die). In particular, a respective edge termination structure can be arranged at each side of the device between the latter and the respective lateral edge of the die, the device surrounded completely by edge termination structures.

In general, the device formed in the active area can for instance be an IGBT, in particular however a transistor device is formed there. The device, in particular transistor device, can be a vertical device having its load terminals at opposite sides of the semiconductor body, in particular a transistor device having its source region at the frontside and its drain region at the backside. The drain region can extend over the whole backside of the wafer or die, and a backside metallization for contacting the drain region can be arranged on the backside. Vertically below the source region, the body region can be formed, wherein the gate region can be arranged laterally aside, for instance in a gate trench. The latter can extend into the semiconductor body from the frontside thereof, it can be filled with a gate dielectric covering at least a side wall of the trench and a gate electrode made of an electrically conductive material, for instance polysilicon. Vertically in between the body and the drain region, a drift region can be arranged, being of the same conductivity type as the body region but having a lower doping concentration. As a power device, the transistor can for instance have a breakdown voltage of at least 10 V, 20 V or 40 V, with possible upper limits of for instance not more than 800 V, 600 V, 400 V, 200 V or 100 V.

In general, a field electrode can additionally be arranged in the gate trench below the gate electrode. In addition or in particular as an alternative, a field electrode can be arranged in a separate field electrode trench laterally aside the gate trench. Seen in a vertical cross-section, the gate and the field electrode trenches are arranged consecutive in a lateral direction. The gate trenches can for instance be longitudinal trenches which, seen in a top view, can for example form a grid in the active area, the grid defining cells, e.g. rectangular or in particular quadratic cells. In each cell, a needle shaped field electrode trench can be arranged, e.g. centrally in the cell. In the needle trench, a spicular or columnar field electrode can be formed, separated from the semiconductor body by a field dielectric. Together, the field dielectric and the field electrode form a field electrode region of the device.

Generally, a respective shield electrode region of the edge termination structure comprises a respective shield electrode and a respective shield dielectric, which can electrically isolate the shield electrode from the semiconductor body. In particular, the shield electrode and/or shield dielectric can be made of the same material as a field electrode and/or field dielectric of a field electrode region of the device, e.g. the field electrode of polysilicon and/or the field dielectric of silicon oxide. Independently of these details, a connection between the well region and the first inner shield and electrode can for instance be formed by an interconnect, which can for example extend vertically into the semiconductor body and intersect the shield dielectric laterally, see further details below.

In an embodiment, the edge termination structure comprises a second inner shield electrode region which is disposed in the first lateral direction between the device/active area and the first inner shield electrode region. Therein, an electrical connection is formed between the respective second inner shield electrode and a frontside potential region of the semiconductor device, which can for instance be a gate potential region or in particular a source potential region. The shield electrode can for instance be electrically connected to the gate metallization or in particular to the source metallization. In other words, the shield electrode can be connected to the gate potential or in particular to the source potential of the device.

The second inner shield electrode arranged between the device and the first inner shield electrode gives room for the electrical potential to spread, the potential has additional lateral space to grow. In case of a transistor device, the electrical potential can increase along the frontside (in the first lateral direction) from source potential in the cell field to drain potential at the lateral edge of the die, the drain potential reaching up from the backside there.

In an embodiment, a plurality of second inner shield electrode regions with a respective shield electrode in a respective trench are disposed in the first lateral direction between the device and the first inner shield electrode, e.g. at least two second inner shield electrodes. Possible upper limits can for instance be not more than 20, 15, 10, 5 or 3 second inner shield electrodes between the device and the first outer shield electrode region. This relates to the first lateral direction, e.g. in case of needle-shaped shield electrode regions/trenches, a significantly larger number of trenches can be arranged aside each other in a second lateral direction (parallel to the edge of the die). Independently of these details, each of the second inner shield electrodes can be connected to a frontside potential region of the device, e.g. gate potential region or in particular source potential region (see the details above). The electrical connection can for instance be formed in a metal layer on the frontside of the semiconductor body (e.g. a metal layer deposited onto an insulating layer formed on the semiconductor body).

In an embodiment, a plurality of first inner shield electrode regions, each formed in a respective trench and comprising a respective shield electrode, are arranged in the first lateral direction between the device and the outer shield and electrode region, namely at least two or three first inner shield electrode regions (possible upper limits being for instance not more than 10, 8, 6 or 5 first inner shield electrode regions). In particular, a respective well region can be formed adjacent to each respective first inner shield electrode trench, e.g. a respective p-well. These staggered well regions can, independently of whether they are respectively formed with interruptions or extend as a closed line, at least functionally form nested rings tapping the potential at the respective location. In other words, each of the well regions arranged consecutive in the first lateral direction can, e.g. in the second lateral direction, extend basically along a respective electric field potential line.

In an embodiment relating to the plurality of first inner shield electrode regions, the laterally outermost first inner shield electrode is electrically connected to the outer shield electrode. In other words, the electrical potential is tapped from the outermost inner shield electrode region and transferred to the outer shield electrode, see in detail above. The remaining first inner shield electrodes, which are arranged between the outermost one and the device, can respectively be connected to their respective well region solely, apart from that they can be floating. Consequently, at least one floating first inner shield electrode region/well region can be provided inside of the outermost first inner shield electrode region/well region tapping the potential (and transferring it outwards, see above).

In an embodiment, a plurality of outer shield electrode regions, each formed in a respective trench and comprising a respective shield electrode, are arranged in the first lateral direction between the first inner shield electrode region and the lateral edge of the die. In case of a plurality of first inner shield electrode regions, the plurality of outer shield electrode regions are arranged in the first lateral direction between the outermost inner shield electrode region and the lateral edge.

In an embodiment, the shield electrodes of the plurality of outer shield electrodes are each connected to the first inner shield electrode, e.g. to the outermost one in case of a plurality of first inner shield electrodes. In an embodiment, the first inner shield electrode trench/first inner shield electrode are needle-shaped. This can in particular be combined with a device formed in the active area, comprising a needle-shaped field electrode, particularly a plurality of cells each having a needle-shaped field electrode. Independently of these details, the needle-shaped shield electrode can be connected to the well region via an interconnect laterally intersecting the first inner shield dielectric. Seen in a vertical top view, the interconnect can extend into the well region and into the first shield electrode.

Along the well region, e.g. in the second lateral direction, a plurality of needle-shaped first inner shield electrode regions can be arranged, each comprising a first inner shield electrode in a respective needle-shaped trench. In an embodiment, the interconnect connecting one first inner shield electrode to the well region extends along the well region over at least two needle-shaped first inner shield electrodes and connects them to the well region as well. Along the well region, a plurality of interconnects can be arranged consecutively, each connecting some of the first inner shield electrodes to the well region. In particular, each first inner shield electrode arranged at the well region can be connected to the latter.

Generally, the first inner trench or trenches and/or the second inner trench or trenches and/or the outer trench or trenches of the edge termination structure could also have a longitudinal extension in the second lateral direction. In particular, however, at least some of the trenches can be needle-shaped, particularly all trenches of the edge termination structure. In an embodiment, the needle-shaped trenches of the edge termination structure have the same depth and/or width and/or are arranged in the same pattern as needle-shaped trenches of device cells in the active area. The pattern can for instance be a hexagonal or in particular rectangular/quadratic pattern. Forming the trenches of the edge termination structure and the device with the same geometrical properties and/or the same filling can allow for a reuse of existing processing step, e.g. a simultaneous etching and/or filling of the trenches of the device and the edge termination structure.

In an embodiment, a connection element extends in parallel to the well region, wherein a plurality of shield electrodes disposed along the well region are electrically connected to the connection element. The connection element can in particular extend ring-shaped, e.g. as a closed line, around the whole cell field and provide for a connection of the different shield electrodes disposed along the well region to each other, e.g. avoid for instance "islands" with a deviating potential. The connection element can extend on the outside of the well region, namely between the well region and the lateral edge of the die, or in particular on the inside of the well region, namely between the well region and the cell field. The connection element can for instance be disposed laterally between the trench which lies adjacent to the well region and a shield electrode trench following on said trench in the first lateral, either to the outside or to the inside. In an embodiment with a second inner shield electrode region connected to the frontside potential region, in particular source potential (see above), the connection element can for instance be disposed between the second inner shield electrode region and the well region.

In general, the connection element can for example be formed in a metal layer, for instance another metal layer then used for the wiring of the gate electrodes in the cell field with a gate runner extending aside the cell field, so that the connection element formed in one metal layer is not interrupted by the gate connections in the other metal layer. In particular, the connection element can be a trench electrode disposed in a trench. This elongated trench extending around the cell field can, seen in a vertical cross-section perpendicular to its length extension, for instance have the same size like the gate electrode of the device. It can for example be etched and filled simultaneously with the gate trenches in the cell field.

For the connection of the shield electrodes to the connection element, a plurality of connection bridges can be disposed along the length of the connection element, each connecting one or a plurality of the shield electrodes disposed along the well region to the connection element. The connection element can in particular be provided in case of a plurality of needle-shaped first inner shield electrodes, wherein for instance the interconnects disposed along the length of the well region can respectively be connected to the connection element via a respective connection bridge. The connection bridges can be formed in a metal layer, connected for instance to the trench electrode via a vertical interconnect (contact plug) and to the interconnect of the shield electrodes. The connection bridges can for example be formed in the same metallization layer like the interconnect between the first inner shield electrode and the shield electrode(s) further outwards.

In case of a plurality of well regions nested in each other, each having assigned a first inner shield electrode region, a plurality of connection elements can be provided. In particular, a connection element for each well region can be provided, the connection elements nested for instance ring-shaped in each other, like the well regions. For example, each well region can have a respective ring-shaped connection element, e.g. on its inside.

In an embodiment, the device comprises a body region formed in the semiconductor, e.g. a p-body in case of an nMOS. In an embodiment, the well region of the edge termination structure and the body region of the device are made with the same doping type and concentration, which can allow for a reuse of process steps (simultaneous manufacturing).

The application also relates to a method of manufacturing a die disclosed here, the method comprising the steps:

| | |
|---|---|
| i) | forming the shield electrode regions; |
| ii) | forming the well region in the semiconductor body; |
| iii) | electrically connecting the shield electrode of the first inner shield electrode region to the well region; |
| iv) | electrically connecting the shield electrode of the outer shield electrode region to the shield electrode of the first inner shield electrode region. |

In an embodiment, a field electrode region of the device is simultaneously formed in step i) and/or a body region of the device is formed in step ii), see above for further details.

BRIEF DESCRIPTION OF THE DRAWINGS

Below, the die and its structures are explained in further detail by means of exemplary embodiments. Therein, the individual features can also be relevant in a different combination.

DETAILED DESCRIPTION

Figure 1:
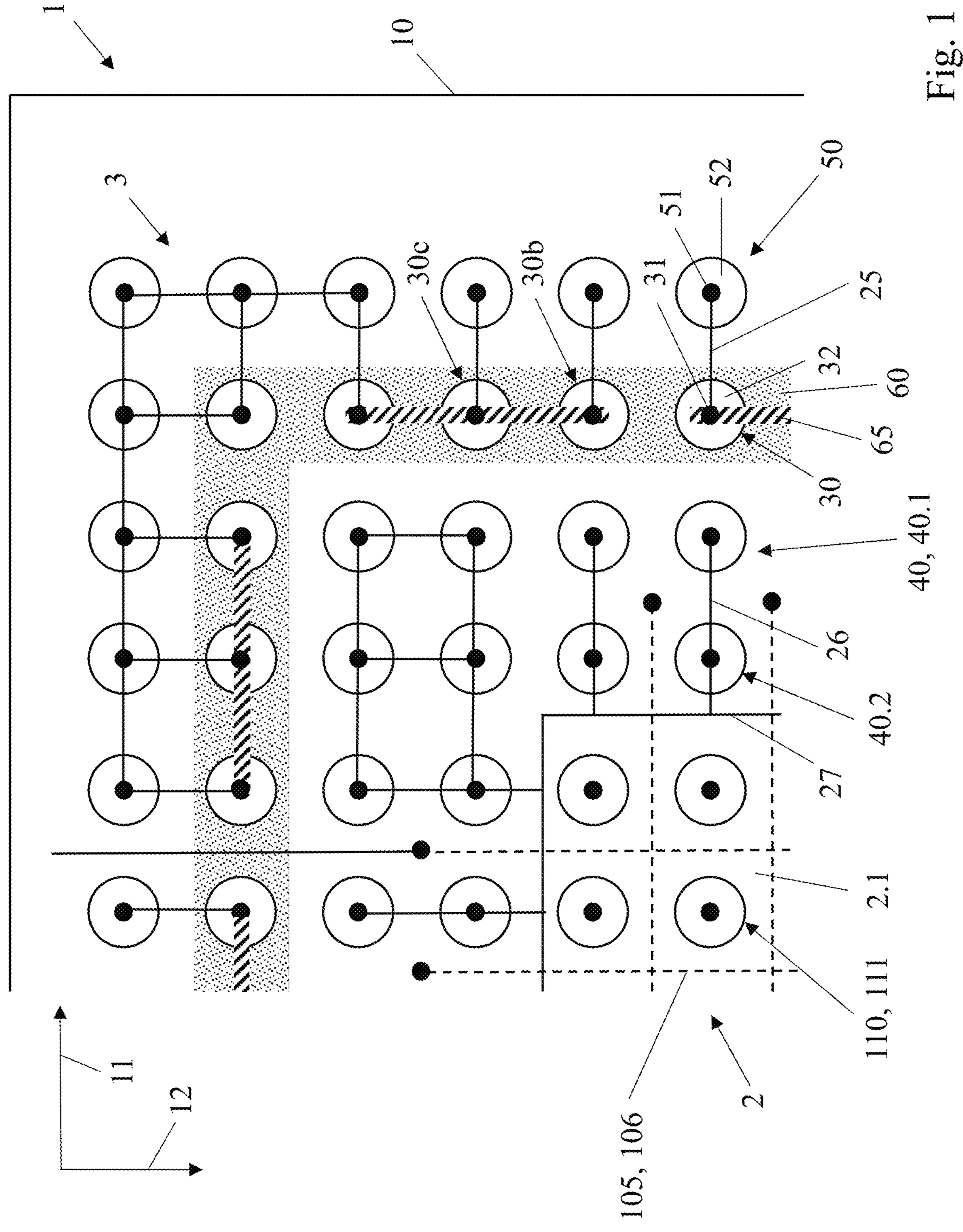
FIG. 1 shows a portion of the die with a first edge termination structure.
Figure 5:
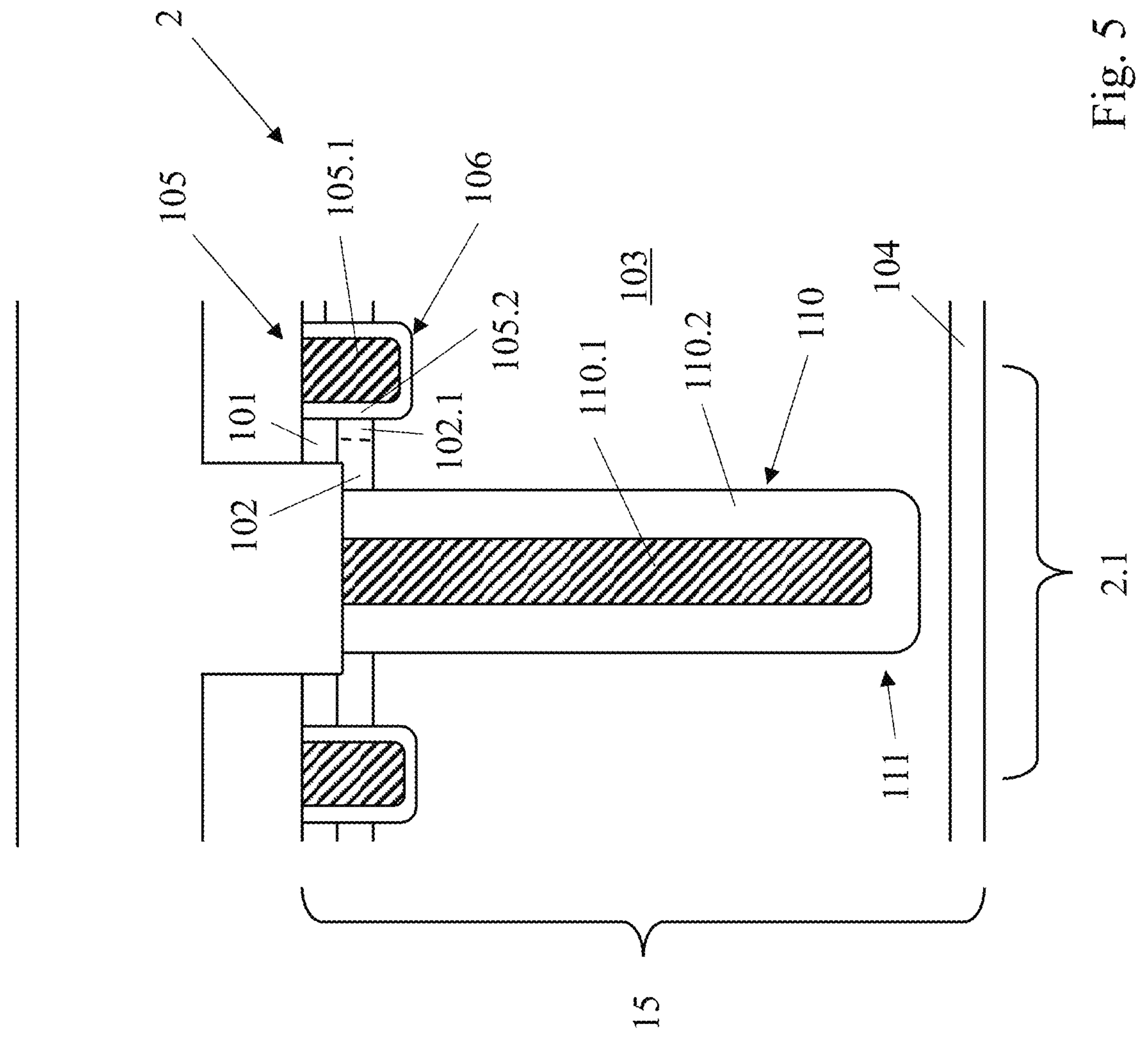
FIG. 5 illustrates a device formed in an active area of the die.

FIG. 1 shows a portion of a die 1 in a vertical top view, wherein a semiconductor device 2 is formed in the die 1 (see FIG. 5 in detail). Between a lateral edge of the die 1 and the device 2, an edge termination structure 3 is formed. It comprises a first inner shield electrode region 30, having a field electrode 31 and a shield dielectric 32. Adjacent to the first inner shield electrode region 30, a well region 60 is formed in the semiconductor body. The shield electrode 31 is electrically connected to the well region 60 via an interconnect 65 that can for instance be realized as a groove contact.

At the lateral edge 10 of the die 1, on the right of the edge termination structure 3 in FIG. 1, the backside drain potential can reach up to the frontside shown here, whereas the frontside can for instance be on source potential in the area of the device 2. With the well region 60, the local potential can be tapped, and the shield electrode 31 is biased to that potential. Additionally, the edge termination structure 3 comprises an outer shield electrode region 50, which is arranged in a first lateral direction 11 between the first inner shield electrode region 30 and the lateral edge 10. The outer shield electrode region 50 comprises a shield electrode 51 and a shield dielectric 52, the former being electrically connected to the shield electrode 31 of the first inner shield electrode region 30. The electrical connection is shown schematically here, it can be formed in or at an insulation layer on the frontside of the semiconductor body. In consequence, the shield electrode 51 of the outer shield electrode region 50 is biased to the electrical potential tapped with the well region 60, see the general description for further details. In this way, the outer shield electrode 51 can be biased to a potential that is larger than the frontside/source potential of the device 2.

In addition to the first inner and the outer shield electrode regions 30, 50, the edge termination structure 3 comprises a second inner shield electrode region 40, in particular a plurality of second inner shield electrode regions 40.1, 40.2 arranged consecutive in the first lateral direction 11 (two second inner shield electrodes in the example of FIG. 1). The second inner shield electrode regions, 40, 40.1, 40.2 respectively comprise a shield electrode 41, 41.1, 41.2 and a shield dielectric 42, 42.1, 42.2 and are connected to a frontside potential of the device 2, namely source potential in this case. This is illustrated by the connection 26 to the frontside metallization 27, namely source plate.

Figure 2:
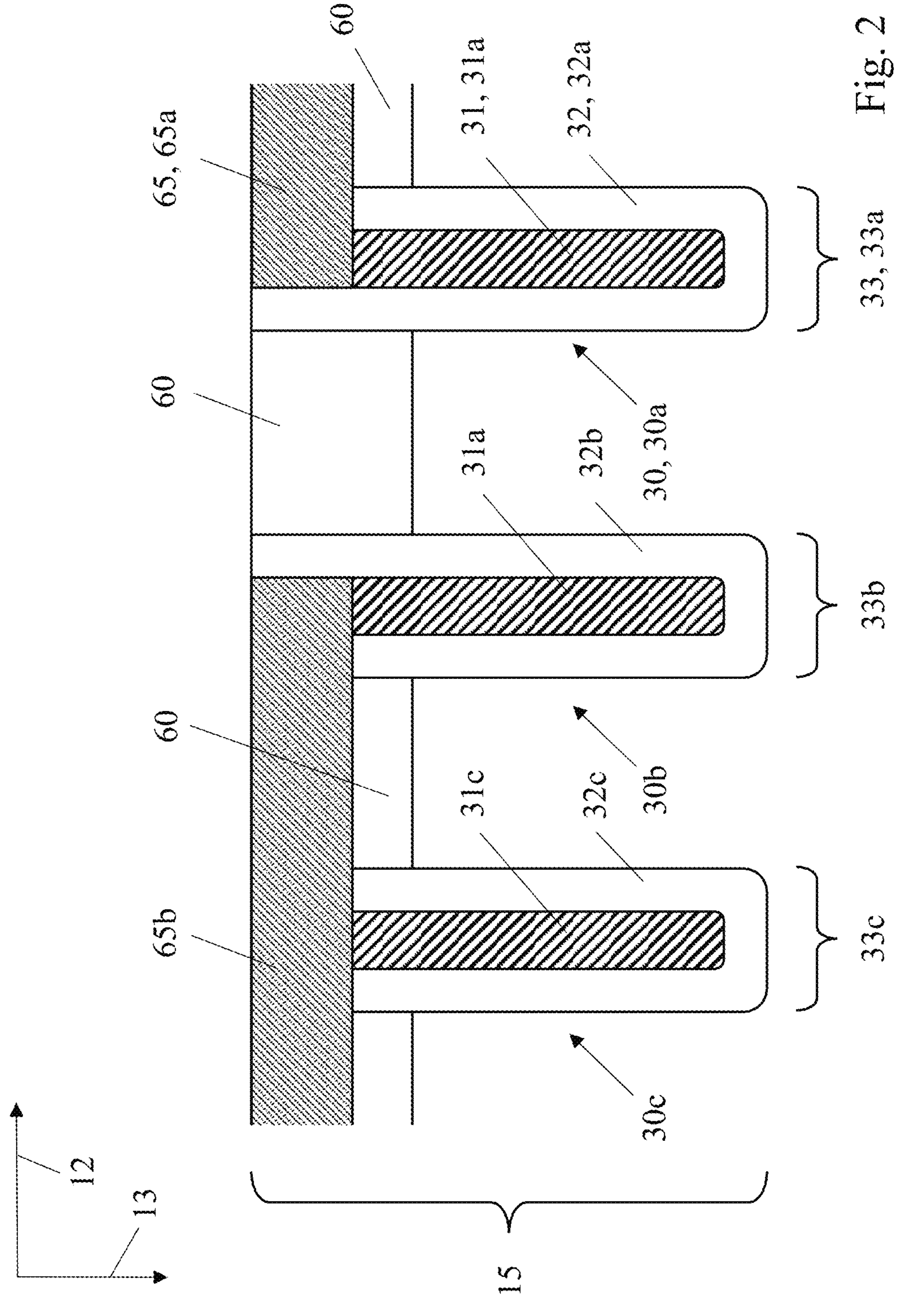
FIG. 2 illustrates a part of the edge termination structure of FIG. 1 in a vertical cross section.

FIG. 2 illustrates the well region 60 and first inner shield electrode region 30 in a vertical cross-section, the sectional plane lying parallel to the vertical direction 13 and to the second lateral direction 12, see FIG. 1 for comparison. Along the second lateral direction 12, a plurality first inner shield electrode regions 30*a-c* are arranged aside each other, each comprising a respective shield electrode 31*a-c* isolated from the semiconductor body 15 via a respective shield dielectric 32*a-c*. The trenches 33*a-c* reach deeper than the well region 60, and the interconnect 65 extends vertically into the well region 60 but not therethrough. Along the second lateral direction, a plurality of interconnects 65*a, b* are formed, each connecting some of the shield electrodes 31*a-c* to the well region 60.

Figure 3:
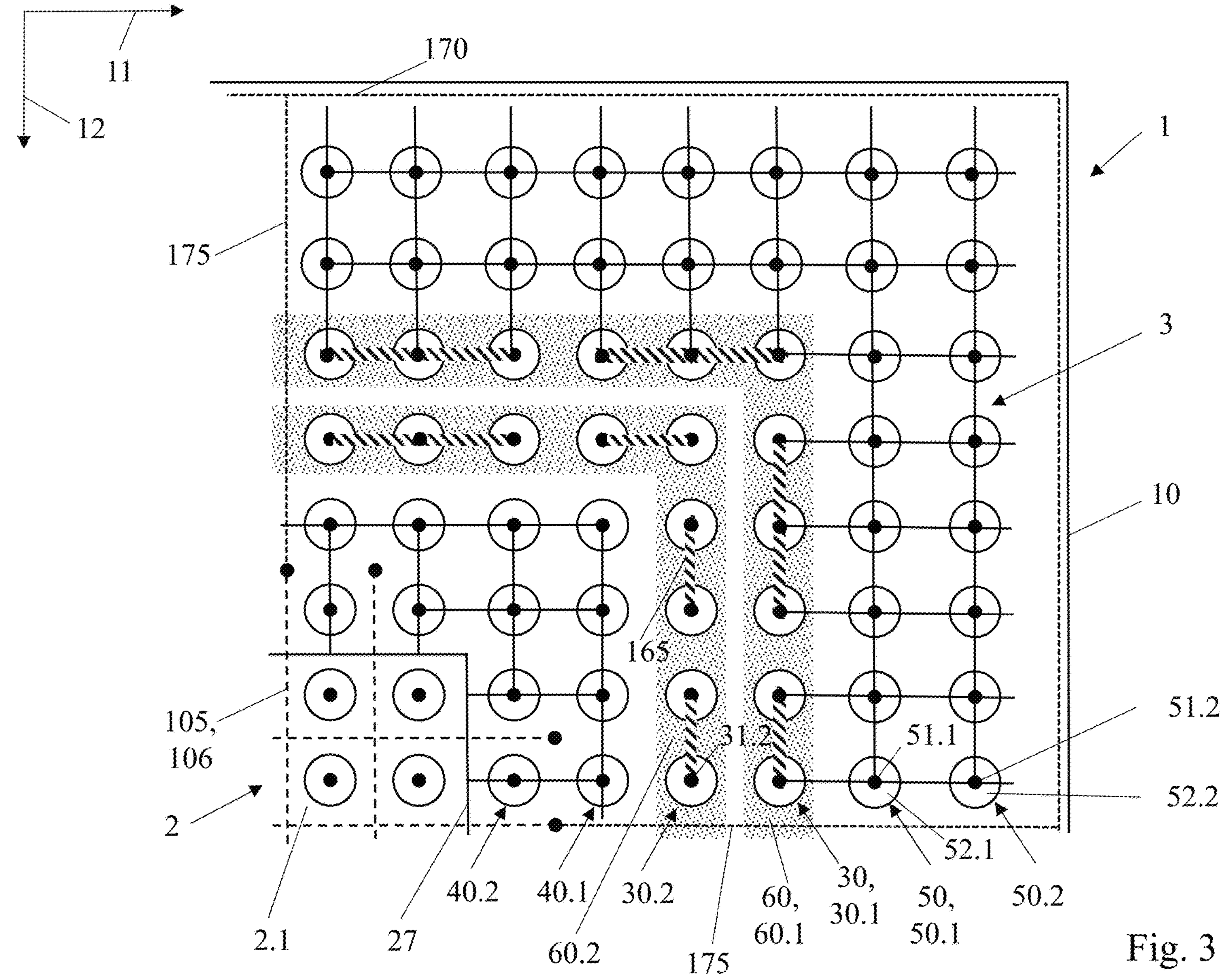
FIG. 3 shows a portion of a die with a second edge termination structure.

FIG. 3 illustrates a portion of a die 1 with a slightly different edge termination structure 3, and in the following description mainly the difference to the embodiment above is discussed. Generally, the like reference numerals indicate the like parts or parts with the like function, and reference is respectively made to the description of the other figures as well. In FIG. 3, a gate runner 170 extending partially or completely around the edge termination structure 3 is shown, connected to the gate region 105 (see also FIG. 5) via gate lines 175. The gate runner can for instance form a closed ring or have a U-shape. In the other Figures, it is not shown for the sake of simplification but can be present as well.

The edge termination structure 3 of FIG. 3 comprises a second first inner shield electrode region 30.2 in addition to the first inner shield electrode region 30 (first first inner shield electrode region 30.1). In addition to the well region 60 (first well region 60.1), a second well region 60.2 is formed inside thereof, adjacent to the second first inner shield electrode region 30.2. The second well region 60.2, which is a p-well like the first well region in the example shown, is, via a vertical interconnect 165, electrically connected to the shield electrode 31.2 of the second first inner shield electrode region 30.2. In contrast to the first inner shield electrode region 30, the latter and its well region 60.2 are not connected to the outer shield electrode regions 50, 50.1, 50.2.

In addition to the outer shield electrode region 50 (first outer shield electrode region 50.1), a second outer shield electrode region 50.2 is provided, each having a respective shield electrode 51.1, 51.2 and a respective shield dielectric 52.1, 52.2. The outer shield electrode regions 50.1, 50.2 are biased to the potential tapped with the well region 60.1.

Figure 4:
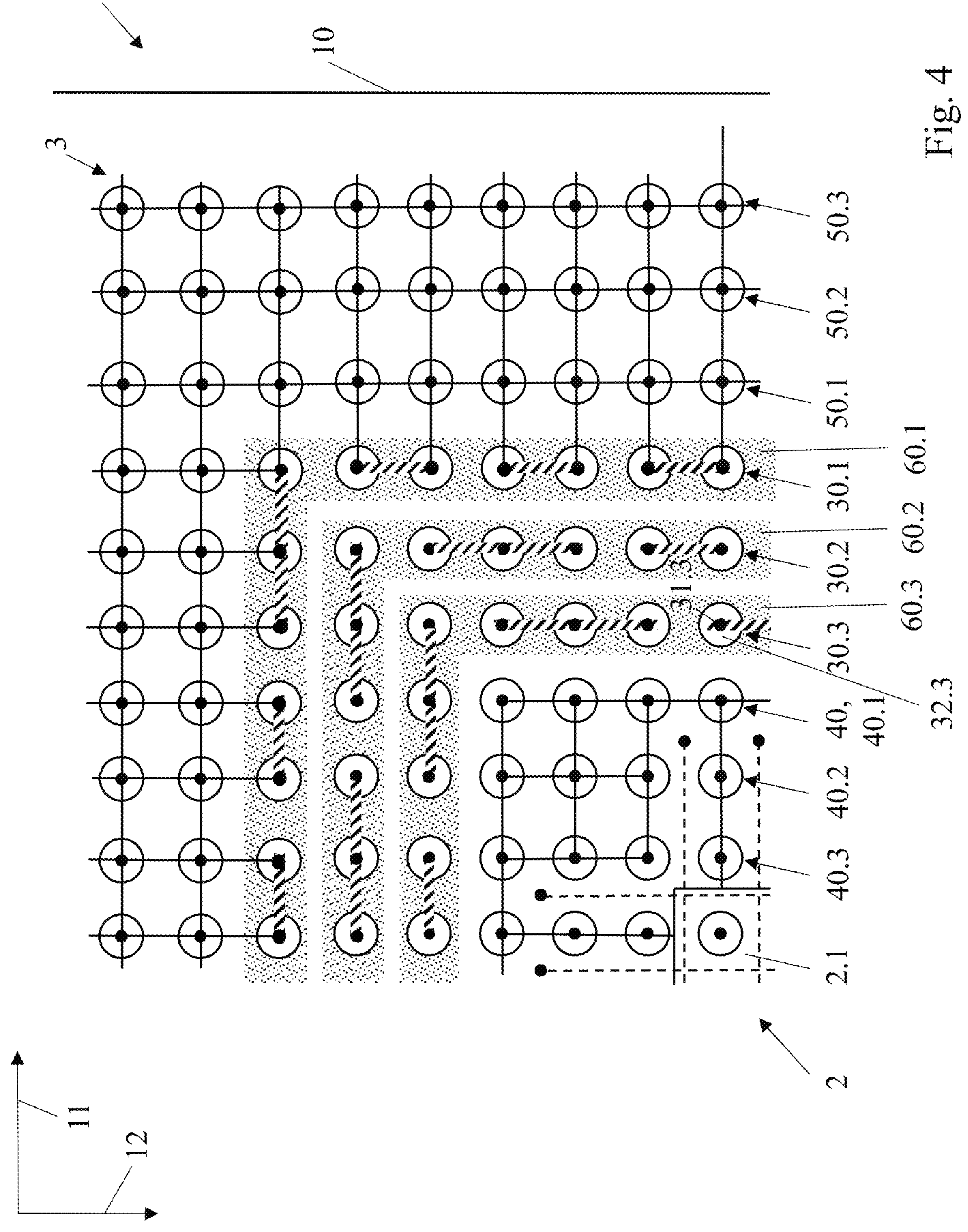
FIG. 4 shows a portion of a die with a third edge termination structure.

FIG. 4 illustrates a further edge termination structure 3, comprising in addition a third first inner shield electrode region 30.3 with a respective shield electrode 31.3 and shield dielectric 32.3. It is arranged between the device 2 and the other first inner shield electrode regions 30.1, 30.2, and its shield dielectric 30.3 is connected to a third well region Like the second well region 60.2, it is floating. Again, the potential is tapped from the well region 60 (first well region 60.1) and transferred to the outer shield electrode regions 50. In the edge termination structure 3 of FIG. 4, three outer shield electrode regions 50.1-50.3 are arranged outside of the first inner shield electrode regions 30.1-30.3, and three second inner shield electrode regions 40.1-40.3 are arranged inside thereof (with respect to the first lateral direction 11, respectively).

FIG. 5 illustrates a device 2 formed in the active area, in particular a device cell 2.1, in a vertical cross-section. It comprises a source region 101 and a body region 102, in which a channel region 102.1 is formed aside a gate region 105. The latter comprises a gate electrode 105.1 and a gate dielectric 105.2 capacitively coupling the gate electrode 105.1 to the channel region 102.1. A drain region 104 is formed at the backside of the semiconductor body 15, vertically between a drift region 103 is arranged. It is made of the same doping type as the drain region 104, but with a lower doping concentration. In the example shown, the source region 101, drift region 103 and drain region 104 are n-type, and the body region 102 is p-type (a $p^+$-doped region forming the ohmic contact is not shown in this schematic drawing).

In practice, one or more inactive trenches can be arranged between an active cell as shown in FIG. 5 and the edge termination structure. In such an inactive trench or cell the body (and body contact) doping can for instance be provided, e.g. together with the contact connecting it to the top/source metallization, while the source implant is for instance omitted. The inactive cells can assure a certain distance between the edge of the top metallization and the active cells, which can reduce or prevent an ion diffusion from the metal edge into the active area. E.g. a wet etched metal edge can also be kept at a distance from the gate landing pats.

The gate electrode 105 is formed in a gate trench 106, which forms a rectangular pattern in top view, see FIG. 1 for comparison (which shows no staggered layout). By applying a voltage to the gate electrode 105.1, a channel formation and, in consequence, vertical current flow can be controlled. In the centre of the cell 2.1, a field electrode region 110 is formed, it comprises a field electrode 110.1 and a field dielectric 110.2 capacitively coupling the field electrode 110.1 to the drift region 103. The field electrode region 110 is formed in a field electrode trench 111 being needle-shaped. The trench 111 has the same depth and width like the trenches of the edge termination structure 3.

Figure 6:
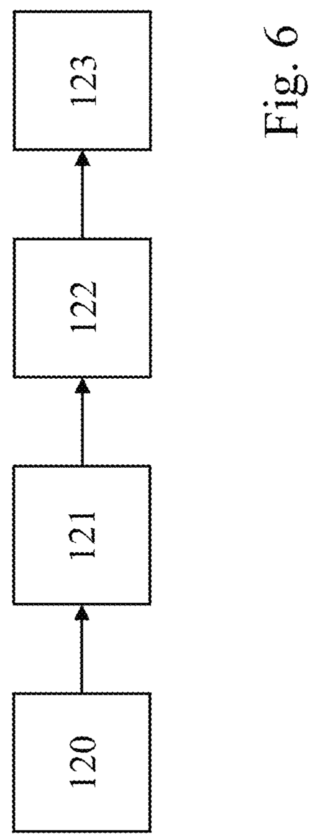
FIG. 6 summarizes some manufacturing steps in a flow diagram.

FIG. 6 summarizes some manufacturing steps in a flow diagram. After forming 120 the shield electrode regions and forming 121 the well region, which can be done in the order shown or in an opposite order or partially simultaneously, the first inner shield electrode is electrically connected 122 to the well region. Further, the outer shield electrode is electrically connected 123 to the first inner shield electrode.

Figure 7:
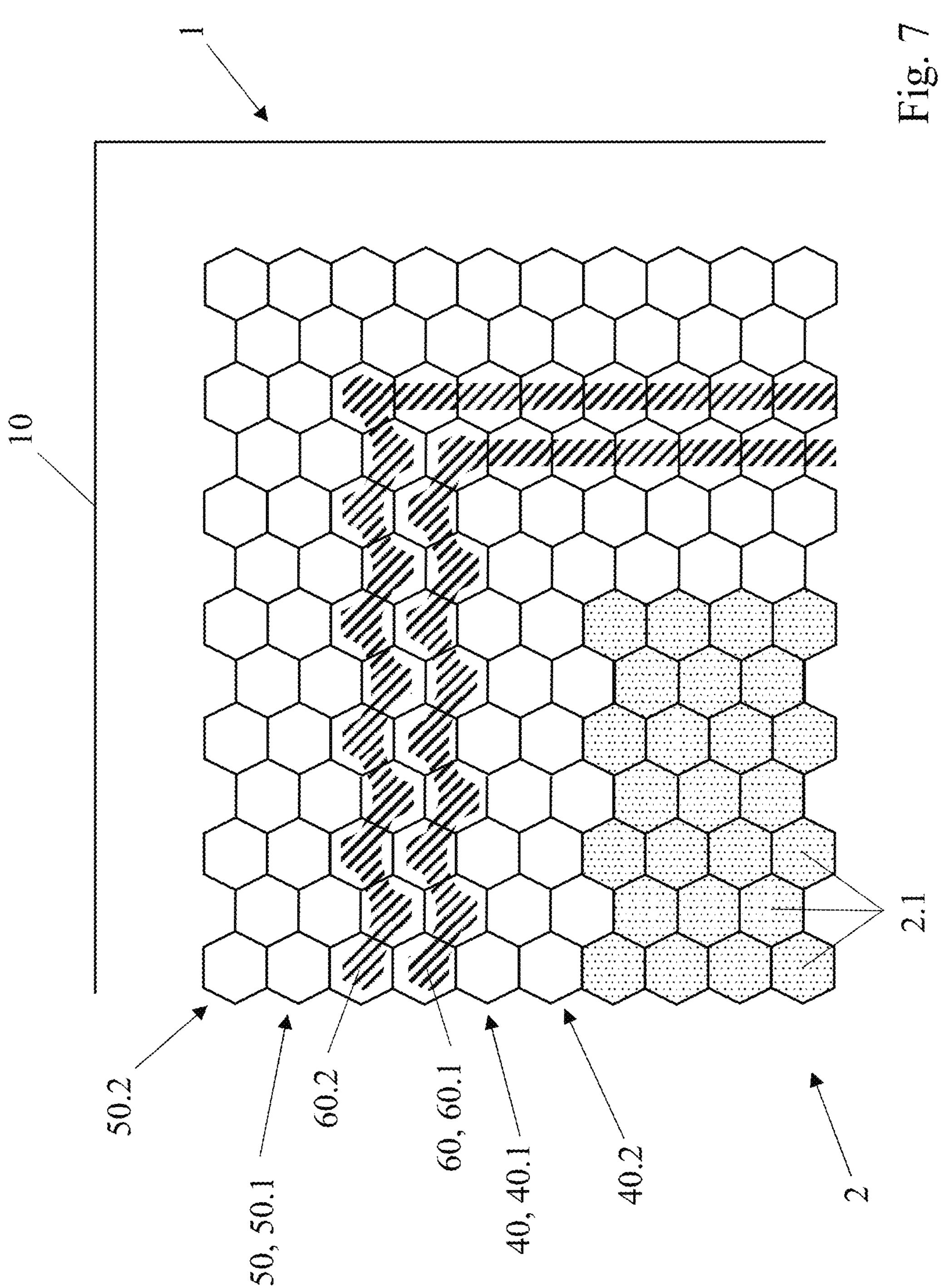
FIG. 7 illustrates a portion of a die with an edge termination structure in case of a different cell pattern in the active area.

FIG. 7 illustrates a portion of another die 1, wherein the device 2 has a different cell pattern compared to the embodiments above. In this example, the cells 2.1 have a hexagonal shape, which can influence the shape of the well regions 60, 60.1, 60.2, as illustrated. To achieve a space saving layout, the shape of the well regions 60, 60.1, 6.2 follows the shape of the cells 2.1 in the active area.

Figure 8:
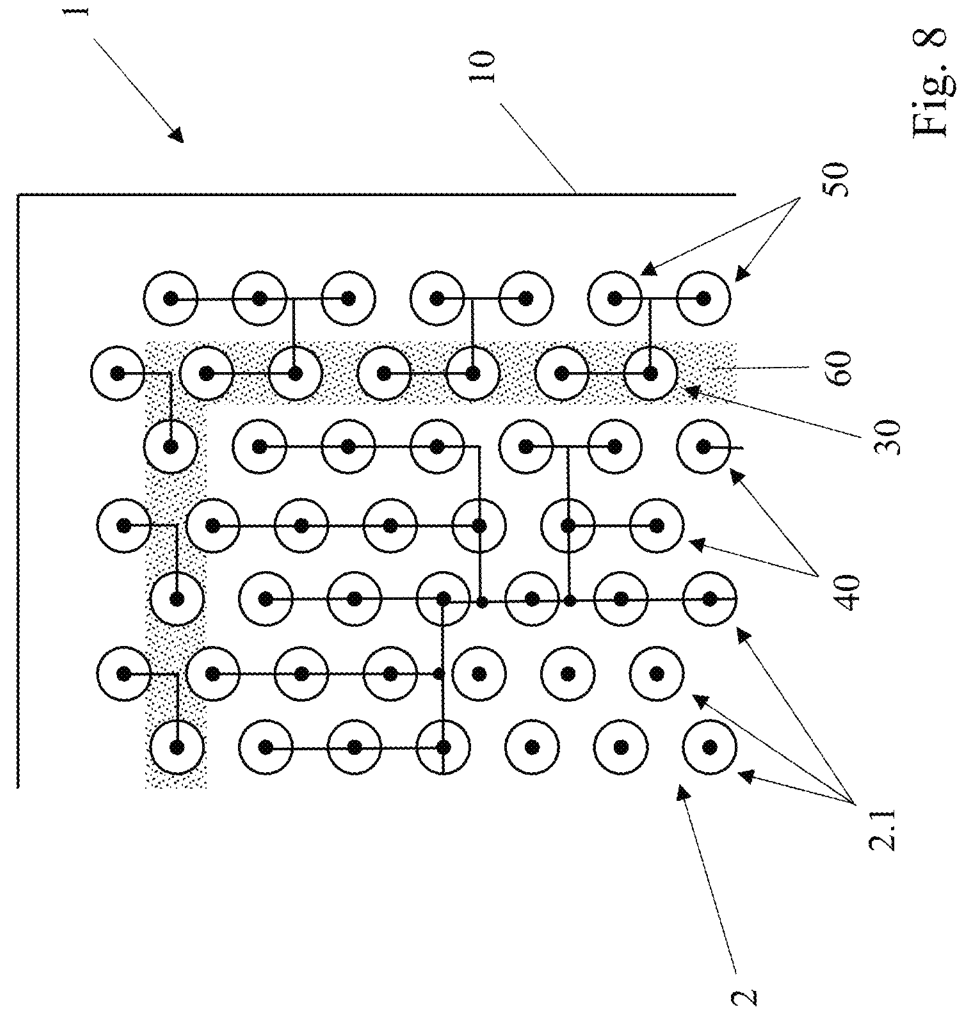
FIG. 8 illustrates another die with an edge termination structure for a non-rectangular cell-pattern.

FIG. 8 illustrates cells 2.1 having a rectangular shape, but being displaced by half a pitch between neighbouring lines. Nonetheless, the basic setup is the same, the electrical potential is tapped via the well region 60 and transferred to the outer shield electrode regions 50, respectively. In the schematic drawing of FIG. 8, round trenches are shown, but they can for instance also have a rectangular or hexagonal shape seen in top view.

Figure 9:
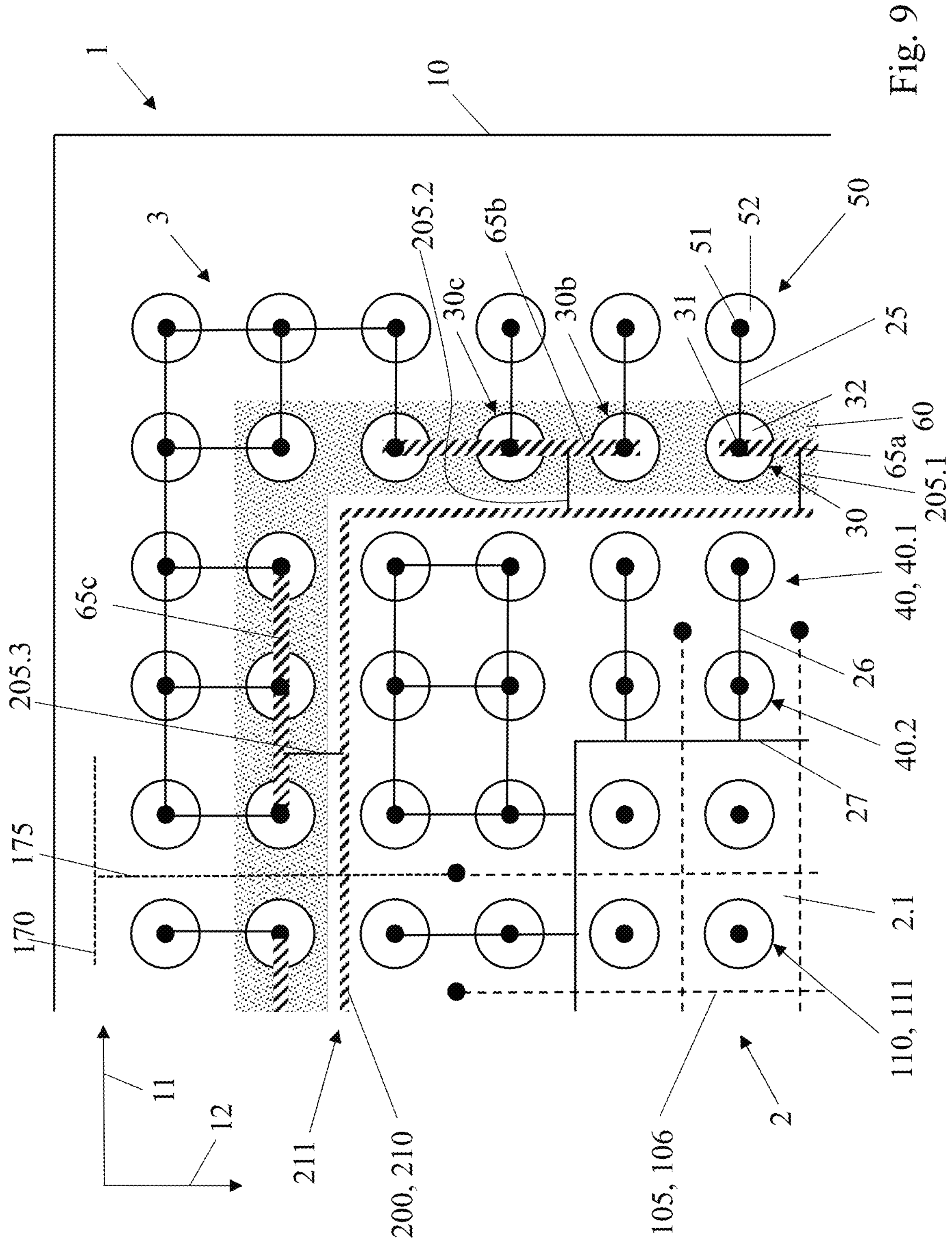
FIG. 9 illustrates a portion of a die with an edge termination structure comparable to FIG. 1 and comprising a connection element in addition.

The edge termination structure 3 shown in FIG. 9 is in principle comparable to the one shown in FIG. 1 and reference is made to the description above. In addition, the edge termination structure 3 of FIG. 9 comprises a connection element 200 running in parallel to the well region 60. Via connection bridges 205.1-205.3 arranged along the length extension of the connection element 200, it is connected to the plurality of interconnects 65*a-c* disposed along the well region 60. Consequently, the plurality of interconnects 65*a-c* are connected to the connection element 200 and clamped to the same potential, which applies also for the shield electrodes 31 connected via the interconnects 65*a-c*.

In the example shown, the connection element 200 is provided as a trench electrode 210 disposed in a longitudinal trench 211. This trench 211 can be etched and filled simultaneously with the gate trenches 106 of the device 2, see FIG. 5 for illustration. Consequently, in a cross-sectional view, the trench electrode 210 can have the same size and properties like the gate electrode 105. Due to its arrangement in the trench 211, the trench electrode 210 is not interrupted by the gate lines 175, it can in particular extend as a closed line around the whole cell field. The connection bridges 205.1-205.3 can be made in a metal layer, for instance the same metal layer in which the shield electrodes 31, 51 are connected.

Figure 10:
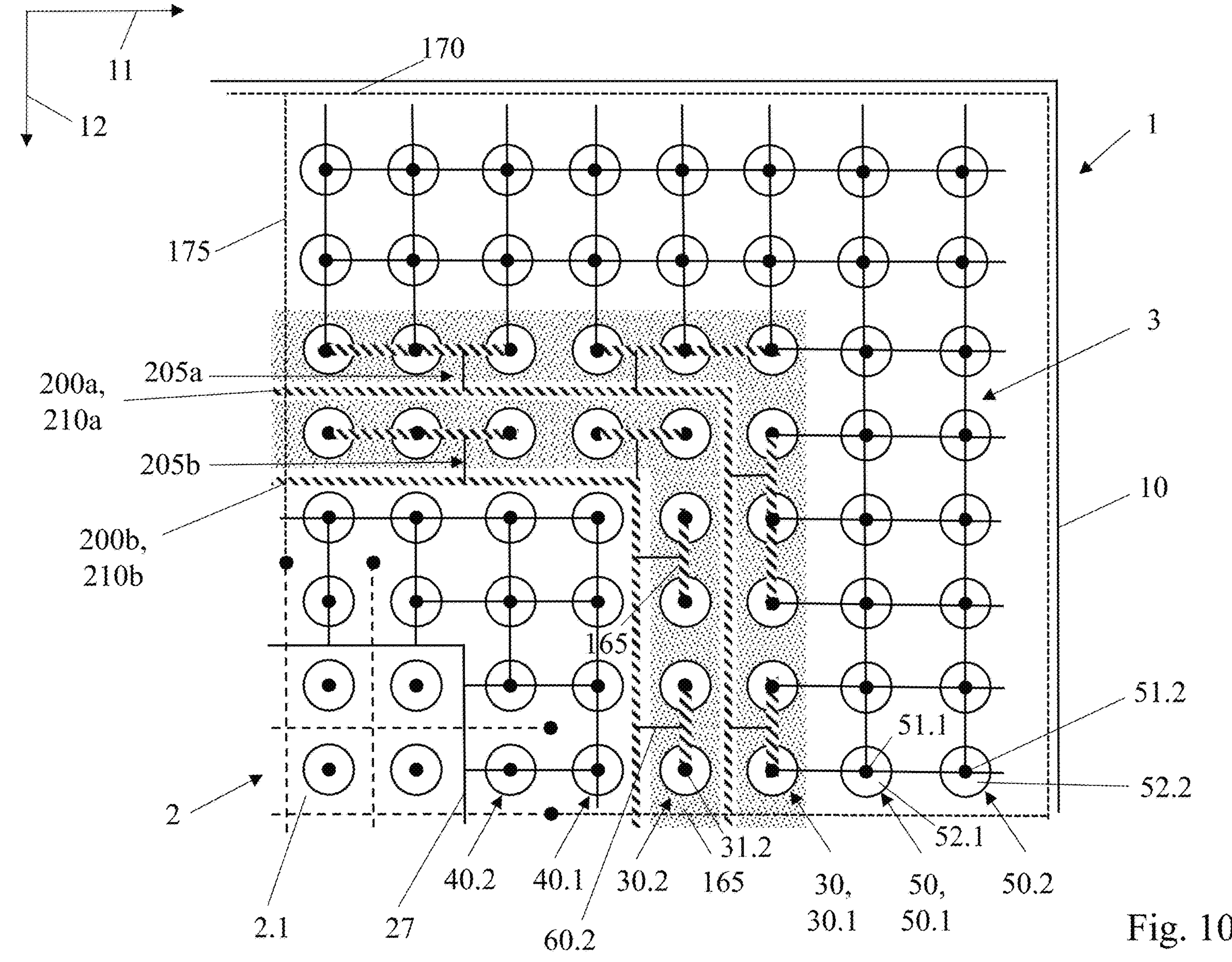
FIG. 10 shows a portion of a die with an edge termination structure comparable to FIG. 3 and comprising connection elements in addition.

FIG. 10 illustrates another edge termination structure 3, namely based on the one shown in FIG. 3. Therein, each of the well regions 60.1, 60.2 has a respective connection element 200*a*, 200*b* extending in parallel thereto around the cell field. The connection elements 200*a*, 200*b* are provided as a respective trench electrode 210*a*, 210*b*, see the comments on FIG. 9. Via respective connection bridges 205*a*, 205*b*, the interconnections 165 and shield electrodes, thus, disposed along the respective well region 60.1, 60.2 are connected to the respective connection element 200*a*, 200*b* (only one connection bridge referenced respectively).

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:

a semiconductor device; and an edge termination structure laterally between the semiconductor device and a lateral edge of the semiconductor die, wherein the edge termination structure comprises:

a first inner shield electrode region with a shield electrode in a trench extending into a semiconductor body;

an outer shield electrode region with a shield electrode in a trench extending into the semiconductor body and disposed in a first lateral direction between the first inner shield electrode region and the lateral edge of the semiconductor die; and a well region of a second conductivity type formed in a region of a first conductivity type in the semiconductor body adjacent the trench of the first inner shield electrode region, wherein the shield electrode of the first inner shield electrode region is electrically connected to the well region, wherein the shield electrode of the outer shield electrode region is electrically connected to the shield electrode of the first inner shield electrode region.

2. The semiconductor die of claim 1, wherein the edge termination structure further comprises a second inner shield electrode region with a shield electrode in a trench and disposed in the first lateral direction between the semiconductor device and the first inner shield electrode region, and wherein the shield electrode of the second inner shield electrode region is electrically connected to a frontside potential region of the semiconductor device.

3. The semiconductor die of claim 2, wherein a plurality of second inner shield electrode regions with a respective shield electrode in a respective trench are disposed in the first lateral direction between the semiconductor device and the first inner shield electrode region and are each connected to the frontside potential region.

4. The semiconductor die of claim 1, wherein a plurality of first inner shield electrode regions are disposed in the first lateral direction between the semiconductor device and the outer shield electrode region, each first inner shield electrode region comprising a respective shield electrode in a respective trench, wherein a respective well region is formed adjacent the respective trench in the semiconductor body, and wherein the respective well region is electrically connected to the respective shield electrode.

5. The semiconductor die of claim 4, wherein the shield electrode of the outer shield electrode region is electrically connected to the shield electrode of an outermost one of the first inner shield electrode regions, the shield electrodes of the other first inner shield electrode regions being each floating and connected only to their respective well region.

6. The semiconductor die of claim 1, wherein a plurality of outer shield electrode regions are disposed in the first lateral direction between the first inner shield electrode region and the lateral edge of the semiconductor die, each outer shield electrode region comprising a respective shield electrode in a respective trench.

7. The semiconductor die of claim 6, wherein the shield electrodes of the outer shield electrode regions are each electrically connected to the shield electrode of the first inner shield electrode region.

8. The semiconductor die of claim 7, wherein the shield electrodes of the outer shield electrode regions are each electrically connected to the shield electrode of the outermost first inner shield electrode region.

9. The semiconductor die of claim 1, wherein the trench and the shield electrode of the first inner shield electrode region are needle-shaped, the needle-shaped shield electrode being electrically connected to the well region via an interconnect which laterally intersects a shield dielectric of the first inner shield electrode region.

10. The semiconductor die of claim 9, wherein a plurality of needle-shaped first inner shield electrode trenches with a respective needle-shaped first inner shield electrode are disposed along the well region in a second lateral direction, the interconnect extending in the second lateral direction over at least two needle-shaped first inner shield electrodes.

11. The semiconductor die of claim 1, wherein the edge termination structure further comprises a plurality of needle-shaped trenches with a respective shield electrode, and wherein the needle-shaped trenches of the edge termination structure have a same depth and/or width and/or are arranged in a same pattern as needle-shaped trenches of device cells of the semiconductor device.

12. The semiconductor die of claim 1, wherein the edge termination structure further comprises a ring-shaped connection element in a form of a trench electrode, which extends along a length of the well region and is connected to a plurality of first inner shield electrodes disposed along the well region in a second lateral direction.

13. The semiconductor die of claim 1, wherein the semiconductor device comprises a body region formed in the semiconductor body, and wherein the body region of the semiconductor device and the well region of the edge termination structure are made with a same dopant type and concentration.

* * * * *